United States Patent  
Lee et al.

(10) Patent No.: US 7,105,059 B2
(45) Date of Patent: Sep. 12, 2006

(54) REACTION APPARATUS FOR ATOMIC LAYER DEPOSITION

(75) Inventors: Jae-cheol Lee, Suwon (KR); Chang-bin Lim, Seoul (KR); Kwi-young Han, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 112 days.

(21) Appl. No.: 10/465,582

(22) Filed: Jun. 20, 2003

(65) Prior Publication Data

US 2004/0007179 A1   Jan. 15, 2004

(30) Foreign Application Priority Data

Jul. 15, 2002   (KR) ............... 10-2002-0041247

(51) Int. Cl.
  *C23C 16/455*  (2006.01)
  *C23C 16/52*   (2006.01)
  *C23C 16/50*   (2006.01)

(52) U.S. Cl. .............. 118/715; 118/712; 118/713; 118/719

(58) Field of Classification Search ............ 118/712, 118/713, 715, 719
  See application file for complete search history.

(56) References Cited

U.S. PATENT DOCUMENTS

| | | | | |
|---|---|---|---|---|
| 5,078,840 A | * | 1/1992 | Ogawa et al. | 205/768 |
| 5,223,001 A | * | 6/1993 | Saeki | 29/25.01 |
| 5,277,747 A | * | 1/1994 | Aspnes | 438/5 |
| 5,456,945 A | * | 10/1995 | McMillan et al. | 427/252 |
| 5,651,867 A | * | 7/1997 | Kokaku et al. | 204/298.25 |
| 5,653,808 A | * | 8/1997 | MacLeish et al. | 118/715 |
| 5,665,214 A | * | 9/1997 | Iturralde | 204/298.03 |
| 5,695,564 A | * | 12/1997 | Imahashi | 118/719 |
| 5,753,320 A | * | 5/1998 | Mikoshiba et al. | 427/572 |
| 5,776,254 A | * | 7/1998 | Yuuki et al. | 118/725 |
| 5,891,251 A | * | 4/1999 | MacLeish et al. | 118/719 |
| 6,015,595 A | * | 1/2000 | Felts | 427/446 |
| 6,085,689 A | * | 7/2000 | Sandhu et al. | 118/723 IR |
| 6,090,209 A | * | 7/2000 | Strodtbeck et al. | 118/715 |
| 6,098,568 A | * | 8/2000 | Raoux et al. | 118/723 E |
| 6,113,984 A | * | 9/2000 | MacLeish et al. | 427/255.32 |

(Continued)

FOREIGN PATENT DOCUMENTS

JP   55-158623 A  * 12/1980  ............... 118/715

(Continued)

OTHER PUBLICATIONS

Jeffrey Elam, Growth and Characterization of Al2o3/ZnO, etc . . . , Department of Chemistry Univ. of Colorado.

(Continued)

*Primary Examiner*—Jeffrie R. Lund
(74) *Attorney, Agent, or Firm*—Lee & Morse, P.C.

(57) ABSTRACT

A reaction apparatus for atomic layer deposition includes a vacuum chamber having a gas inlet, a gas outlet, and a gas flow path for connecting the gas inlet and the gas outlet; a reactor located in the vacuum chamber, including a reaction chamber where a first gas, which is input through the gas flow path, reacts with a specimen in the reaction chamber, the reactor further including a gas distributor, which is located in the reaction chamber to evenly supply the gas; a specimen location controller for moving the specimen located in the vacuum chamber to the reaction chamber; and an analyzer, which is connected to the reaction chamber, for analyzing a second gas generated in the reaction chamber. The apparatus is able to deposit uniform atomic layers on a specimen by maintaining the pressure and flow of reactant gas and can deposit and analyze an atomic layer simultaneously.

10 Claims, 6 Drawing Sheets

U.S. PATENT DOCUMENTS

| | | | | |
|---|---|---|---|---|
| 6,156,151 | A * | 12/2000 | Komino et al. | 156/345.29 |
| 6,190,459 | B1 * | 2/2001 | Takeshita et al. | 118/715 |
| 6,267,840 | B1 * | 7/2001 | Vosen | 156/345.33 |
| 6,344,084 | B1 * | 2/2002 | Koinuma et al. | 117/201 |
| 6,409,837 | B1 * | 6/2002 | Hillman | 118/712 |
| 6,472,299 | B1 * | 10/2002 | Hiraoka et al. | 438/509 |
| 6,531,069 | B1 * | 3/2003 | Srivastava et al. | 216/67 |
| 6,539,890 | B1 * | 4/2003 | Felts | 118/723 R |
| 6,617,095 | B1 * | 9/2003 | Kitano et al. | 430/313 |
| 6,709,523 | B1 * | 3/2004 | Toshima et al. | 118/725 |
| D490,450 | S * | 5/2004 | Hayashi et al. | D15/199 |
| D496,008 | S * | 9/2004 | Takahashi et al. | D13/182 |
| 6,821,910 | B1 * | 11/2004 | Adomaitis et al. | 438/758 |
| 2001/0053530 | A1 * | 12/2001 | Klein et al. | 435/7.1 |
| 2003/0221708 | A1 * | 12/2003 | Ly et al. | 134/18 |
| 2004/0007179 | A1 * | 1/2004 | Lee et al. | 118/715 |
| 2004/0266011 | A1 * | 12/2004 | Lee et al. | 436/5 |

FOREIGN PATENT DOCUMENTS

| | | | | |
|---|---|---|---|---|
| JP | 01-301585 A | * | 12/1989 | 118/712 |
| JP | 05-179426 | * | 7/1993 | |

OTHER PUBLICATIONS

Chung et al., Novel MIS-Ta2O5/TiO2 Capacitor, etc . . . May 15, 2001., Samsung Electronics Co., Ltd.

* cited by examiner

REACTION APPARATUS FOR ATOMIC LAYER DEPOSITION

BACKGROUND OF THE INVENTION

1. Field of the Invention

The present invention relates to a reaction apparatus for atomic layer deposition (ALD). More particularly, the present invention relates to a reaction apparatus for ALD that is able to maintain the pressure and the flow of a reactant gas in a reaction chamber.

2. Description of the Related Art

Atomic layer deposition (ALD) technology, wherein reaction mixtures are sequentially input and removed, is one of several possible thin-layer growing technologies necessary in the fabrication of semiconductor devices. A reaction apparatus for ALD deposits atomic layers on a surface of a specimen using reactant gases that react with the surface of the specimen.

FIG. 1A illustrates a schematic view of a conventional reaction apparatus for ALD using a traveling method. Here, the traveling method, i.e., a continuous gas flow method, continuously supplies gases to a specimen in order to deposit atomic layers. Referring to FIG. 1A, gases are continuously supplied through a gas inlet 11, which is connected to a reaction chamber 13, wherein input gases react with a specimen 17 arranged in the reaction chamber 13 to form atomic layers on the surface of the specimen 17. Thereafter, the gases are exhausted to the outside through a gas outlet 15.

The conventional reaction apparatus for ALD using the traveling method reduces the amount of time required to switch gases and forms atomic layers having excellent uniformity; however, it is difficult to apply to a large-sized substrate.

FIG. 1B illustrates a schematic view of a conventional reaction apparatus for ALD using a showerhead method. Here, in the showerhead method, reactant gases are sprayed onto a specimen via a showerhead arranged in a reaction chamber. Referring to FIG. 1B, gases are input to a reaction chamber 23 via a gas inlet 21 and evenly sprayed onto a specimen 27 through a showerhead 29. Thereafter, the gases are exhausted to the outside through a gas outlet 25.

The conventional reaction apparatus for ALD using the showerhead method easily forms atomic layers on a large-sized substrate; however, it is difficult to adjust a distance between the specimen 27 and the showerhead 29.

The reaction apparatuses for ALD of FIGS. 1A and 1B have gas outlets 15 and 25 having a size larger than a size of the corresponding gas inlets 11 and 21, respectively. Accordingly, whereas residual reactant gases after the reaction process can be easily exhausted to the outside, the apparatuses require a large amount of reactant gases because these structures require the reactant gases to be continuously supplied during the reaction process. In addition, the conventional reaction apparatus for ALD is fabricated in a single unit so that it is difficult to additionally install an analyzer that measures reaction by-products generated during the reaction process or that measures the thickness, the density, or the chemical binding state of the atomic layers.

SUMMARY OF THE INVENTION

The present invention provides a reaction apparatus for atomic layer deposition (ALD) that is able to reduce an amount of source gas and an amount of reactant gas and that is able to analyze reaction by-product gases during the deposition of atomic layers.

According to an aspect of the present invention, there is provided a reaction apparatus for atomic layer deposition (ALD), including a vacuum chamber having a gas inlet, a gas outlet, and a gas flow path for connecting the gas inlet and the gas outlet; a reactor located in the vacuum chamber, including a reaction chamber where a first gas, which is input through the gas flow path, reacts with a specimen, which is located in the reaction chamber, the reactor further including a gas distributor, which is located in the reaction chamber to evenly supply the gas; a specimen location controller for moving the specimen located in the vacuum chamber to the reaction chamber; and an analyzer, which is connected to the reaction chamber, for analyzing a second gas generated in the reaction chamber.

Preferably, the analyzer is connected to the reaction chamber via a microtube.

Preferably, the gas distributor may include a first gas distributor for evenly supplying the first gas, which is input to the reaction chamber via the gas inlet; and a second gas distributor, which is connected to an upper portion of the reaction chamber, for exhausting the second gas generated in the reaction chamber to the gas outlet in order to homogenize the second gas in the reaction chamber.

The first and second gas distributors are preferably formed of circular meshes having a plurality of holes. Preferably, a diameter of the first gas distributor is larger than a diameter of the second gas distributor.

The analyzer may be a quadrupole mass spectrometer (QMS) or a residual gas analyzer.

The vacuum chamber may further include a plurality of ports for installing an ellipsometer. The vacuum chamber may further include a specimen transfer path for transferring the specimen to the outside of the vacuum chamber. The vacuum chamber may further include a plurality of specimen transfer ports, which are connected to the specimen transfer path. The specimen transfer ports may be connected to a photoelectronic spectrometer, which is arranged outside of the reaction apparatus.

The reaction apparatus for ALD according to an embodiment of the present invention is able to deposit uniform atomic layers on a specimen by maintaining the pressure and the flow of the reactant gas. In addition, the reaction apparatus according to an embodiment of the present invention includes an analyzer in the reaction apparatus to measure the reaction process by analyzing the reaction by-products generated while maintaining deposition conditions. Furthermore, the reaction apparatus may include an external analyzer to analyze a specimen in order to deposit and analyze an atomic layer simultaneously.

BRIEF DESCRIPTION OF THE DRAWINGS

The above and other features and advantages of the present invention will become more apparent to those of ordinary skill in the art by describing in detail a preferred embodiment thereof with reference to the attached drawings in which.

DETAILED DESCRIPTION OF THE INVENTION

Korean Patent Application No. 2002-41247, filed on Jul. 15, 2002, and entitled: "Reaction Apparatus for Atomic Layer Deposition," is incorporated by reference herein in its entirety.

The present invention will now be described more fully hereinafter with reference to the accompanying drawings, in which a preferred embodiment of the invention is shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1A:
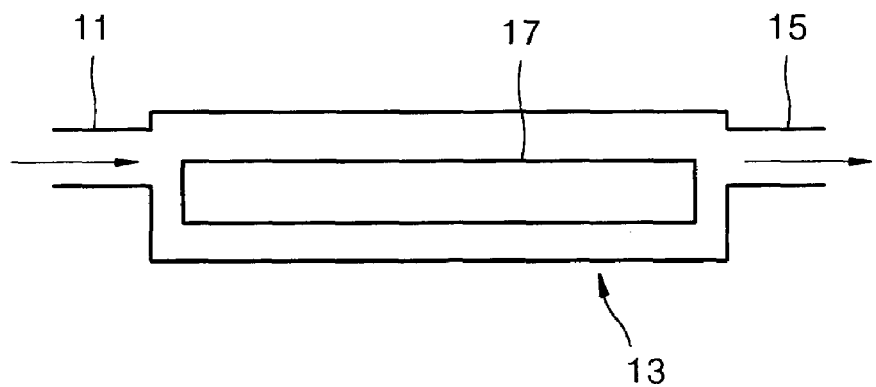
FIG. 1A illustrates a schematic view of a conventional reaction apparatus for atomic layer deposition (ALD) using a traveling method.
Figure 1B:
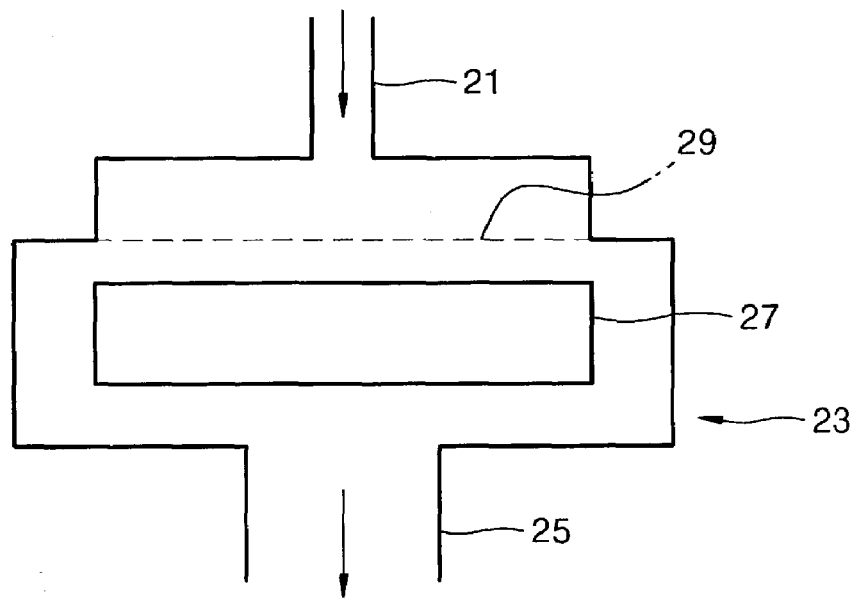
FIG. 1B illustrates a schematic view of a conventional reaction apparatus for ALD using a showerhead method.
Figure 2:
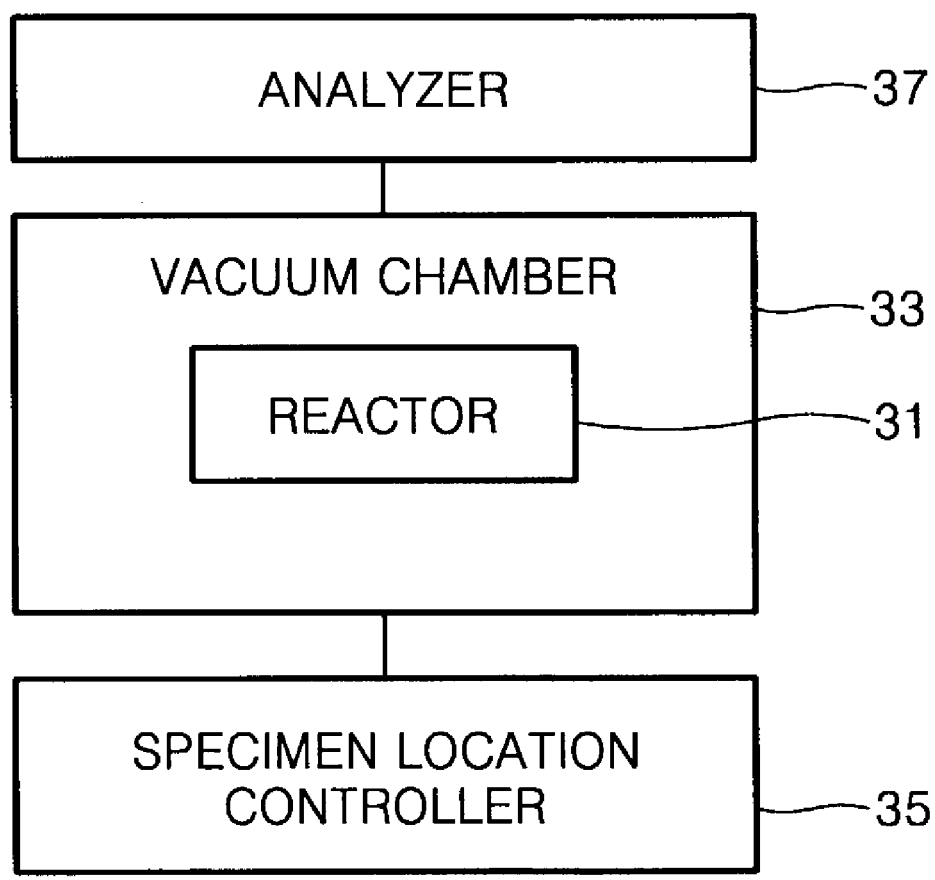
FIG. 2 is a schematic view illustrating a reaction apparatus for ALD according to an embodiment of the present invention.

FIG. 2 is a schematic view illustrating a reaction apparatus for atomic layer deposition (ALD) according to an embodiment of the present invention. Referring to FIG. 2, the reaction apparatus for ALD includes a reactor 31, a vacuum chamber 33 including the reactor 31, a specimen location controller 35 for moving a specimen into and within the vacuum chamber 33, and an analyzer 37 for analyzing reaction by-product gases in the reactor 31.

The interior of the vacuum chamber 33 is evacuated to provide an atmosphere for facilitating the generation of physical and chemical reactions in the reactor 31. Subsequently, a source gas and a reactant gas are input to the reactor 31 so that atomic layers are formed due to reaction of the source gas and the reactant gas with the specimen in the reactor 31. Here, the reaction gases and by-products that are generated during the ALD process are qualitatively and quantitatively analyzed using the analyzer 37, which is connected to the reactor 31. In addition, the specimen location controller 35 arranged at the outside of the vacuum chamber 33 moves the specimen in the vacuum chamber 33 to a proper location in the reactor 31.

Figure 3:
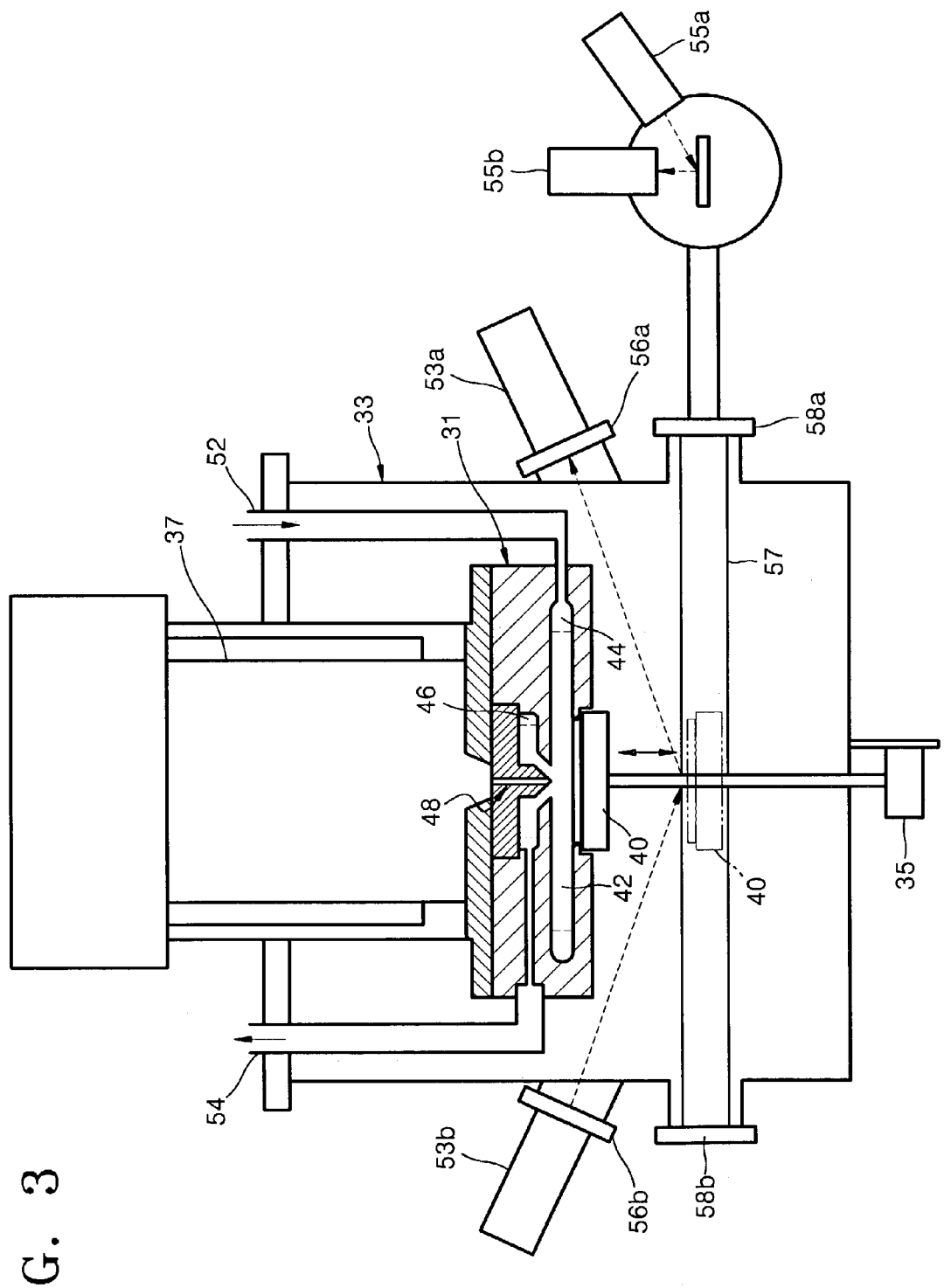
FIG. 3 illustrates a partial cross-sectional view of a reaction apparatus for ALD according to an embodiment of the present invention.

FIG. 3 illustrates a partial cross-sectional view of the reaction apparatus for ALD according to the present invention. The reaction apparatus according to an embodiment of the present invention incorporates a combined method based on the traveling method and the showerhead method.

Referring to FIG. 3, the reactor 31 includes a reaction chamber 42, wherein the ALD occurs on the specimen 40 by the source gas and the reactant gas, a first gas distributor 44, which evenly supplies the reactant gas to the reaction chamber 42, and a second gas distributor 46, which exhausts the reaction by-product gases after the ALD reaction occurs on the specimen 40 in order to evenly maintain and homogenize the reaction gases in the reaction chamber 42.

Preferably, the first gas distributor 44 has a diameter that is larger in size than a diameter of the second gas distributor 46.

In addition, the vacuum chamber 33 includes the reactor 31 for ALD or chemical vapor deposition (CVD), a gas inlet 52 for inputting gases to the reactor 31, a gas outlet 54 for exhausting the reaction by-product gases after the reaction process in the reactor 31, a specimen transfer path 57 for moving the specimen 40, first and second specimen transfer ports 58a and 58b, which are connected to the specimen transfer path 57 to transfer the specimen 40 to a photoelectronic spectrometer 55b arranged at the outside of the reaction apparatus, and first and second ports 56a and 56b for connecting an ellipsometer 53a and a light source 53b, respectively.

The reactor 31 and the analyzer 37 are preferably arranged integrally in the vacuum chamber 33 in order to perform ALD and analysis processes simultaneously. In other words, since the gases, which are generated during the ALD process, are analyzed, the reaction state of the reaction process can be analyzed in real time, and the deposition and the analysis may be performed simultaneously without using additional equipment. Alternately, another analyzer may be arranged outside the vacuum chamber 33.

The specimen location controller 35 moves the specimen 40 to a predetermined location in the reaction chamber 42 to deposit atomic layers or moves the specimen 40 toward the first and second ports 56a and 56b to which the ellipsometer 53a is connected to measure the thickness and density of atomic layers formed on the specimen 40.

An example of the analyzer 37 includes a quadrupole mass spectrometer (QMS) or a residual gas analyzer that is connected to the reaction chamber 42 via a microtube 48. The QMS or the residual gas analyzer detects and analyzes the gases generated during the ALD process, the reaction by-product gases, and the gases removed from the specimen 40.

More specifically, the QMS measures the molecular weights of ions. The ions in the gas state are distributed by the quadrupole according to the ratio of mass to electric charge. A detector collects the distributed ions and amplifies electric signals proportional to the number of ions. In addition, a data system detects the amplified electric signals to convert the electric signals to a mass spectrum.

The ellipsometer 53a is connected to the first port 56a and the light source 53b is connected to the second port 56b. The light source 53b inputs a polarized beam to the specimen 40 and the ellipsometer 53a detects information on the specimen 40 using a reflected polarized The photoelectronic spectrometer 55b is connected to the first and second specimen transport ports 58a and 58b. The photoelectronic spectrometer 55b inputs a specific X-ray by X-ray source 55a to the specimen 40 and analyzes the energy of photoelectrons that are emitted from the surface of the specimen 40 in order to detect the composition and the chemical binding state of the atomic layers on the specimen 40.

The source gas and the reactant gas are input to the reaction chamber 42 via the gas inlet 52 and evenly supplied to the reaction chamber 42 using the first gas distributor 44. The source gas and the reactant gas react with the specimen 40 to deposit the atomic layers on the surface of the specimen 40. Subsequently, the residual gas is collected to the central portion of the specimen 40 and exhausted to the gas outlet 54 via the second gas distributor 46. The gas generated during the ALD process, the reaction by-product gas, and the gas removed from the specimen 40 are input to the analyzer 37 via the microtube 48. When the analyzer 37 is a QMS, the gases are analyzed according to the above-described method.

The gases in the vacuum chamber 33 move from the reaction chamber 42 having a high pressure to the analyzer 37 having a low pressure via the microtube 48. Here, the flow rate of the gases is determined by the length and the section area of the microtube 48, the pumping rate of a pump that maintains the vacuum state of the vacuum chamber 33, and the like.

Figure 4:
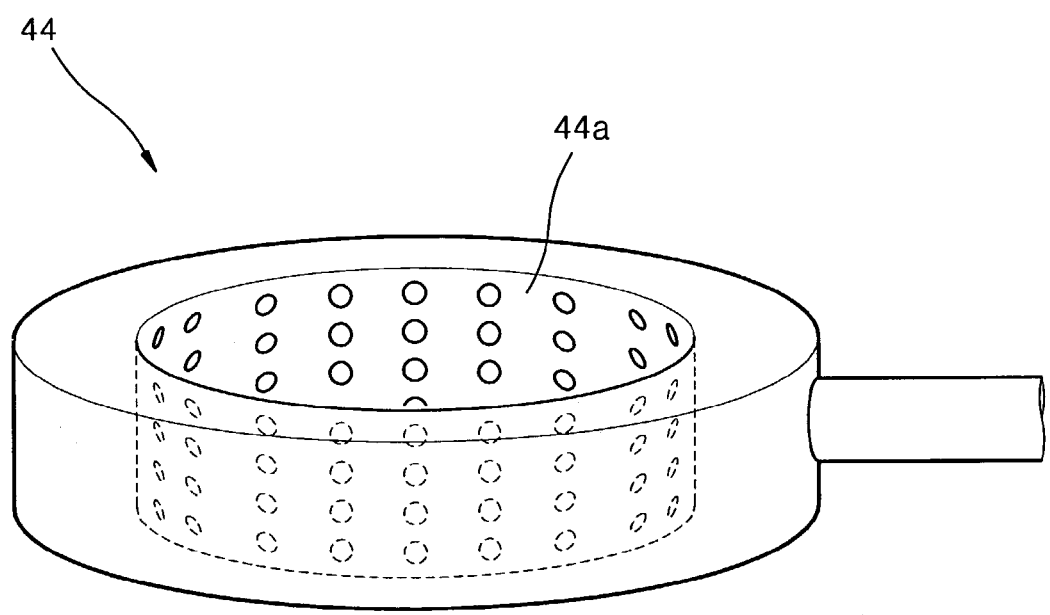
FIG. 4 illustrates a perspective view of a first gas distributor of a reaction apparatus for ALD according to an embodiment of the present invention.

FIG. 4 illustrates a perspective view of the first gas distributor in the reaction apparatus for ALD according to an embodiment of the present invention. Referring to FIG. 4, a mesh 44a having a plurality of holes may be formed in the first gas distributor 44 to evenly spray the gas, which is input from the outside, to the reaction chamber 42. The second gas distributor 46 may have a structure similar to that of the first gas distributor 44. Accordingly, the gases, which are generated in the reaction chamber 42, are efficiently exhausted to the gas outlet 54 to evenly maintain and homogenize the gases in the reaction chamber 42.

In the ALD process, when the source gas is deposited on the surface of the specimen to less than two layers, i.e., one layer, the source gas is not further deposited on the specimen due to a self-limited reaction. Accordingly, when an amount of source gas is larger than an amount required to form one layer, the amount of source gas is reduced to decrease the waste of the source gas. In addition, the waste of the source gas and the reactant gas may be significantly reduced by forming the first and second gas distributors 44 and 46, an example of which is shown in FIG. 4, and by flowing the source gas and the reactant gas to the outside of the mesh 44a having a large area.

Figure 5A:
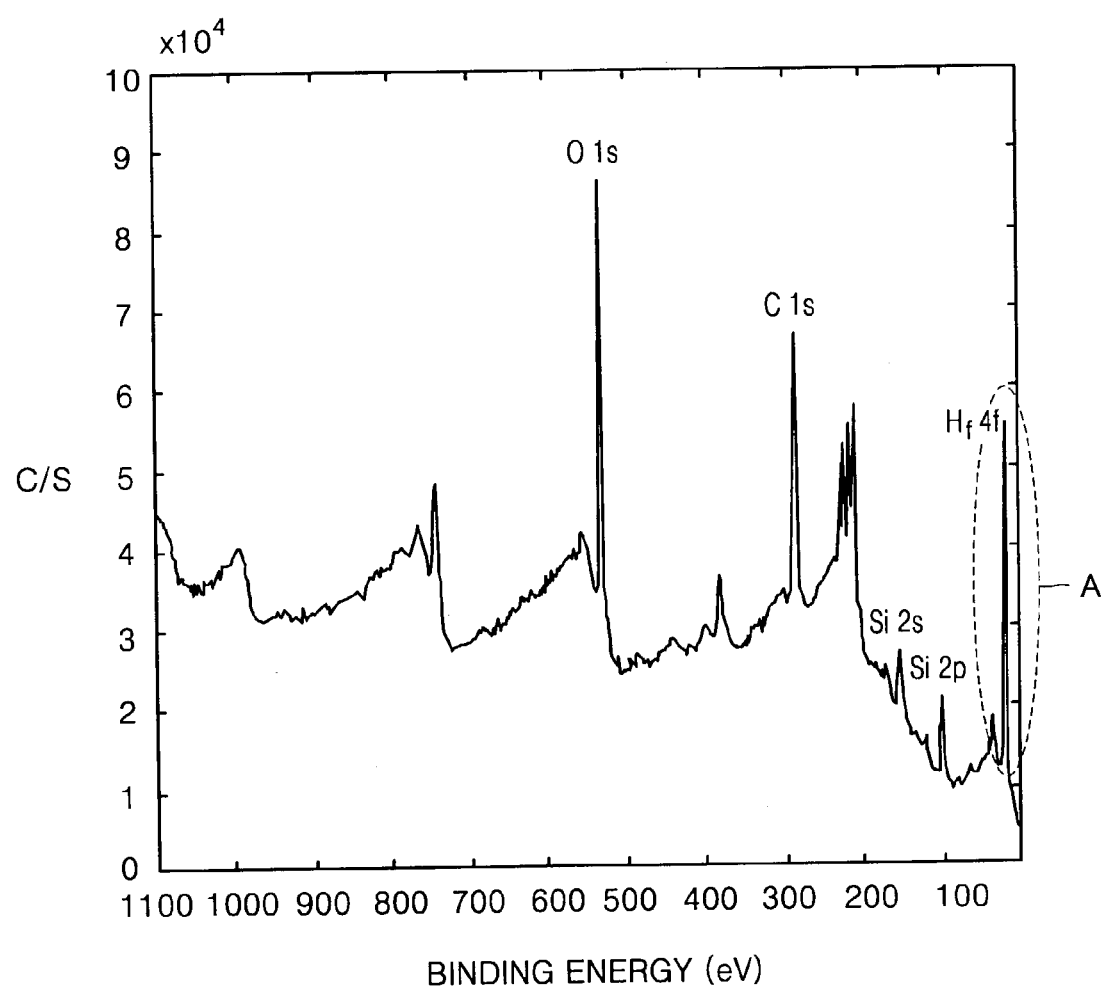
FIG. 5A is a graph illustrating a photoelectronic spectroscopic analysis spectrum, which is obtained from atomic layers deposited using a reaction apparatus for ALD according to an embodiment of the present invention.
Figure 5B:
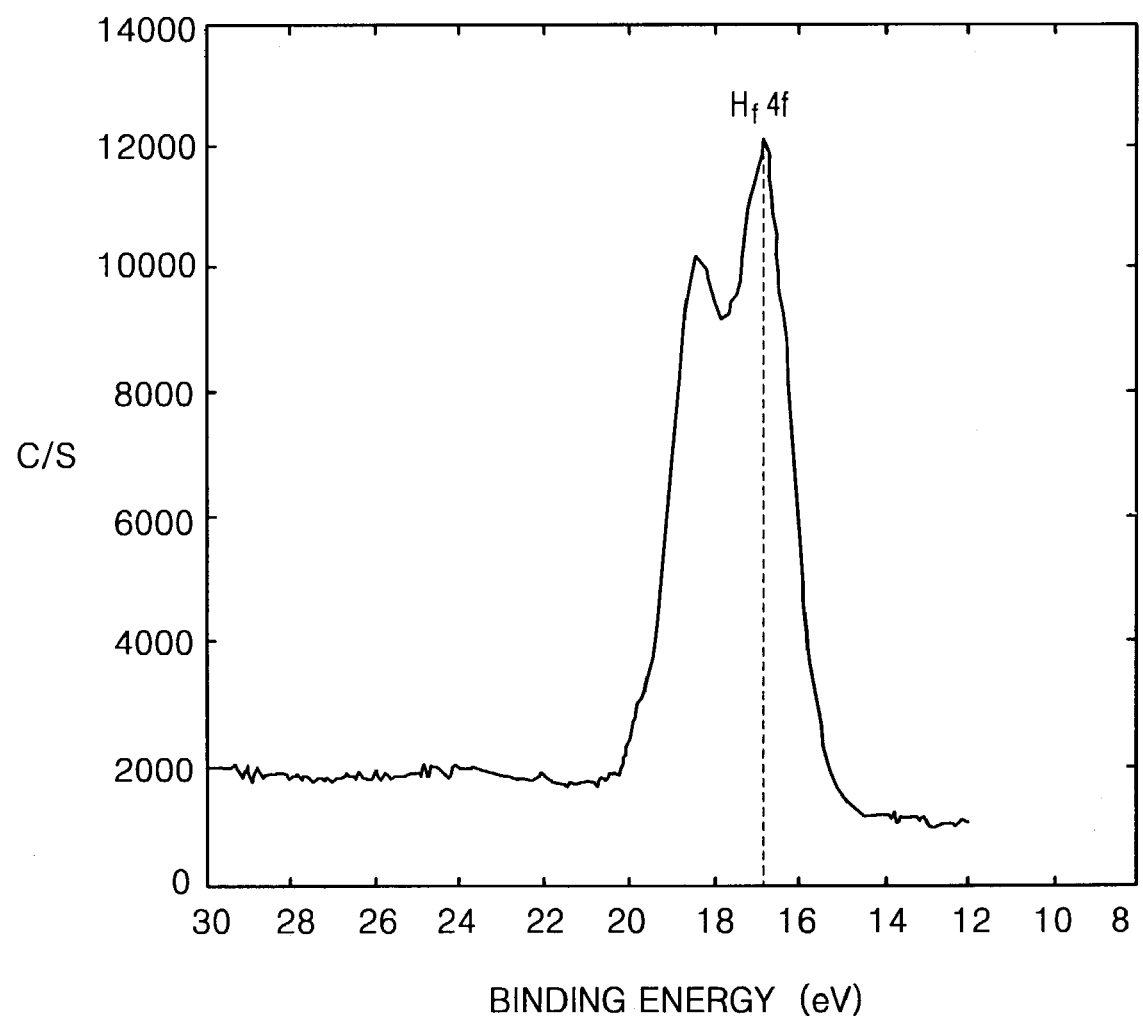
FIG. 5B is a graph illustrating portion A of FIG. 5A.

FIG. 5A is a graph illustrating a photoelectronic spectroscopic analysis spectrum, which is obtained from the atomic layers deposited using the reaction apparatus for ALD according to an embodiment of the present invention. FIG. 5B is a graph illustrating portion A of FIG. 5A.

The graph of FIG. 5A is the photoelectronic spectroscopic analysis spectrum that is obtained from a hafnium oxide ($HfO_2$) thin layer deposited to a thickness of about 3 nm on a silicon substrate, on which a silicon oxide ($SiO_2$) layer having a thickness of about 2 nm is deposited. The processes for depositing the $HfO_2$ thin layer on the $SiO_2$ layer of the silicon substrate will now be described.

First, hafnium chloride ($HfCl_4$) as a source gas is input through the gas inlet 52 of the reaction apparatus for ALD and purged. Hydrogen oxide ($H_2O$) as a reactant gas is then input through the gas inlet 52 and purged. Thus, hafnium chloride ($HfO_2$), hydrogen ($H_2$), and hydrogen chloride (HCl) as reactant gases are generated by chemical reactions. When the reactant gases are input, the reactant gases are evenly distributed to the reaction chamber 42 by the first gas distributor 44, and the generated reaction by-product gases are easily exhausted through the gas outlet 54 by the second gas distributor 46.

Referring to FIG. 5A, a hafnium (Hf) peak, which is generated from a Hf 4f orbital electron of the $HfO_2$ thin layer, a silicon (Si) 2p peak and a Si 2s peak, which are generated from the silicon substrate, and a carbon (C) 1s peak and an oxygen (O) 1s peak, which are generated from contamination due to the exposure of the specimen to the air, are illustrated from right to left along the x-axis.

FIG. 5B is a graph illustrating portion A of FIG. 5A in which the Hf 4f peak is shown. Referring to FIG. 5B, the Hf 4f peak occurs at a binding energy of about 17 eV, which is lower than a binding energy of about 19 eV, which is where a peak occurs in the case of including only a Hf element. Accordingly, it is known that the detected Hf 4f peak is generated from $HfO_2$.

The reaction apparatus for ALD according to an embodiment of the present invention is able to analyze the reaction by-product gases generated in the reaction chamber while performing ALD or CVD. In addition, the reaction apparatus for ALD according to an embodiment of the present invention is able to perform ALD and the reaction analysis simultaneously without requiring separate equipment.

As described above, the reaction apparatus for ALD according to an embodiment of the present invention can deposit uniform atomic layers on a specimen by maintaining the pressure and the flow of the reactant gas. In addition, the reaction apparatus according to an embodiment of the present invention is able to measure the reaction by-products generated during the reaction process and measure the thickness, the density, and the chemical binding state of the atomic layers while maintaining deposition conditions.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A reaction apparatus for atomic layer deposition (ALD), comprising:
   a vacuum chamber having a gas inlet, a gas outlet, and a gas flow path for connecting the gas inlet and the gas outlet;
   a reactor located in the vacuum chamber, including a reaction chamber where a first gas, which is input through the gas flow path, reacts with a specimen, which is located in the reaction chamber, the reactor further including a gas distributor, which is located in the reaction chamber to evenly supply the gas;
   a specimen location controller for moving the specimen located in the vacuum chamber to the reaction chamber; and
   an analyzer, which is connected to the reaction chamber, for analyzing a second gas generated in the reaction chambers,
   wherein the gas distributor comprises:
   a first annular gas distributor having a first vertical mesh inner wall for evenly supplying the first gas, which is input to the reaction chamber via the gas inlet, the first gas exiting the first vertical mesh inner wall in a horizontal direction: and
   a second annular gas distributor having a second vertical mesh inner wall, which is connected to an upper portion of the reaction chamber, for exhausting the second gas generated in the reaction chamber to the gas outlet in order to homogenize the second gas in the reaction chamber, the second gas entering the second vertical mesh inner wall in a horizontal direction.

2. The reaction apparatus as claimed in claim 1, wherein the analyzer is connected to the reaction chamber via a microtube.

3. The reaction apparatus as claimed in claim 1, wherein the first and second gas distributors are formed of circular meshes having a plurality of holes.

4. The reaction apparatus as claimed in claim 3, wherein a diameter of the first gas distributor is larger than a diameter of the second gas distributor.

5. The reaction apparatus as claimed in claim 1, wherein the analyzer is a quadrupole mass spectrometer (QMS).

6. The reaction apparatus as claimed in claim 1, wherein the analyzer is a residual gas analyzer.

7. The reaction apparatus as claimed in claim 1, wherein the vacuum chamber further comprises a plurality of ports for installing an ellipsometer.

8. The reaction apparatus as claimed in claim 1, wherein the vacuum chamber further comprises a specimen transfer path for transferring the specimen to the outside of the vacuum chamber.

9. The reaction apparatus as claimed in claim 8, wherein the vacuum chamber further comprises a plurality of specimen transfer ports, which are connected to the specimen transfer path.

10. The reaction apparatus as claimed in claim 9, wherein the specimen transfer ports are connected to a photoelectronic spectrometer, which is arranged outside of the reaction apparatus.

* * * * *